Figure 1:
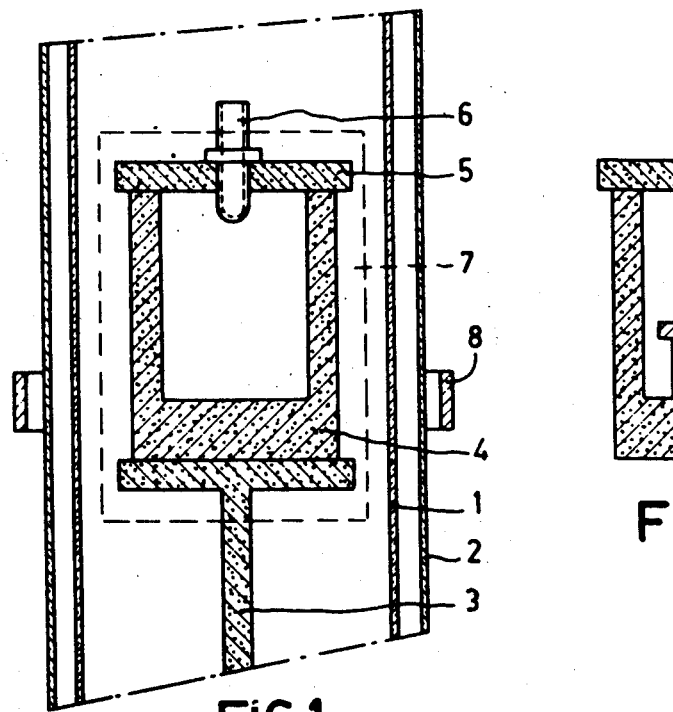

United States Patent [19]

Knippenberg et al.

[11] 4,013,503
[45] * Mar. 22, 1977

[54] FILAMENTARY SILICON CARBIDE CRYSTALS BY VLS GROWTH IN MOLTEN IRON

[75] Inventors: Wilhelmus Franciscus Knippenberg; Gerrit Verspui, both of Eindhoven, Netherlands

[73] Assignee: North American Philips Corporation, New York, N.Y.

[*] Notice: The portion of the term of this patent subsequent to Mar. 20, 1990, has been disclaimed.

[22] Filed: July 25, 1975

[21] Appl. No.: 599,087

Related U.S. Application Data

[63] Continuation of Ser. No. 226,284, Feb. 14, 1972, abandoned, which is a continuation of Ser. No. 690,005, Dec. 12, 1967, abandoned.

[30] Foreign Application Priority Data

Dec. 14, 1966 Netherlands .................. 6617544
Mar. 8, 1967 Netherlands .................. 6703609

[52] U.S. Cl. .................. 156/609; 156/606; 156/614; 156/624; 264/165; 423/346; 423/439; 427/249; 427/82
[51] Int. Cl.² .................. B01J 17/26; B01J 17/32; C01B 31/36

[58] Field of Search .......... 156/609, 610, 613, 614, 156/606, 605, 624; 423/439, 345, 346; 427/249, 82; 264/165

[56] References Cited

UNITED STATES PATENTS

| | | | |
|---|---|---|---|
| 3,053,635 | 9/1962 | Shockley | 23/301 |
| 3,346,414 | 10/1967 | Elles et al. | 117/106 |
| 3,493,431 | 2/1970 | Wagner | 23/301 |
| 3,546,032 | 12/1970 | Basart | 23/301 |
| 3,721,732 | 3/1973 | Knippenberg et al. | 423/346 |

OTHER PUBLICATIONS

Patrick et al., "Physical Review", vol. 143, pp. 526–536 (3/1966).

Primary Examiner—Norman Yodkoff
Assistant Examiner—Barry J. Hollander
Attorney, Agent, or Firm—Frank R. Trifari; Ronald L. Drumheller

[57] ABSTRACT

A method of growing silicon carbide whiskers from a gaseous phase by means of a vapor-liquid-solid mechanism on a substrate using iron in a finely divided state as a solvent for the silicon carbide.

5 Claims, 4 Drawing Figures

FILAMENTARY SILICON CARBIDE CRYSTALS BY VLS GROWTH IN MOLTEN IRON

This is a continuation of application Ser. No. 226,284 filed Feb. 14, 1972, now abandoned, which is a continuation of application Ser. No. 690,005 filed Dec. 12, 1967, now abandoned.

The invention relates to a method of manufacturing filamentary silicon carbide crystals and to articles consisting entirely or in part of these crystals.

Filamentary crystals are to include herein beside crystals of round cross-section crystals of polygonal, for example, hexagonal cross-section and ribbon-shaped crystals.

As is known, such filamentary crystals, in technology generally referred to as whiskers, are used for reinforcing plastics, glass and metals for insulation purposes, for filters and the like.

With regard to their favourable mechanical properties even at extremely high and low temperatures and to their chemical resistance, silicon carbide whiskers are particularly suitable for the said applications.

In the literature, various methods of manufacturing silicon carbide whiskers have been described. The yields of the crystals, their dimensions and the uniformity thereof varied greatly.

For example, in an atmosphere containing hydrogen and nitrogen, fibres of cubic silicon carbide were obtained from a mixture of silica and carbon at temperatures lying between 1375° C and 1550° C, the diameter of the said fibres varying between 0.1 $\mu$ and 5 $\mu$ and their length varying between 10 $\mu$ and a few cms (British patent specification No. 1,015,844).

It has further been described that at temperatures lying between 1400° C and 1600° C a fibrous mass of cubic silicon carbide was formed on a graphite substrate from mixtures of a methylchlorosilane and hydrogen or of silicon chloride, hydrocarbon and hydrogen, in which event a few whiskers of hexagonal silicon carbide having a thickness of from 3 $\mu$ to 10 $\mu$ were locally found which had a length of up to 1 cm. (K. M. Merz. Proc. Conf. silicon carbide, Boston 1959, pages 73–84, Perganon Press 1960).

It has also been stated (Physical Review 143 (1966) 526) that when a methylchlorosilane is reduced with hydrogen at temperatures lying between 1350° C and 1430° C, crystals of hexagonal silicon carbide can be deposited on a graphite substrate. The number and the dimensions of the crystals then could not be controlled, however. The largest crystals had a length of 3 mm and a thickness of 300 $\mu$. When metals such as Cr, Al, Fe, Co, Cu, Si or Au were locally applied by vapour deposition to the substrate, the yield of crystals was increased, but their dimensions were smaller. It was found that in this case no crystal growth takes place by means of a vapour-liquid-solid (VLS) mechanism.

On the contrary, other authors (Transactions of Metallurgical Soc. of A.J.M.E., 233 (1965) 1053) are of opinion that whisker growth can indeed take place by means of a VLS-mechanism. As is known, the substance to be crystallized is absorbed from a gaseous phase into a molten drop of a metal constituting a solvent for said substance and is deposited epitaxially after saturation of the drop on the subjacent substrate crystal. It was found that such a crystal growth could be achieved for various substances and as a matter of fact very particular requirements must be imposed on the solvent with respect to wetting of the crystal substrate. If the wetting is excessively low, the contact between the drop and the substrate is insufficient to obtain a growth throughout the cross-section of the crystal. In the case of a satisfactory wetting, which can generally be expected with solvents in which the substance to be crystallized is dissolved satisfactorily, the drop flows out along the sides of the crystal substrate and an anisotropic growth necessary for the formation of whiskers cannot be achieved.

The last-mentioned authors have stated that by means of VLS growth silicon carbide whiskers could be obtained when the solvent consisted of silicon.

However, the present experiments leading to the invention have shown that of the metals considered unserviceable for VLS growth of silicon carbide whiskers according to "Physical Review" 143 (1966) 526, iron is particularly suitable for this purpose and is even considerably more suitable with respect to the yield, the dimensions of the crystals and the uniformity of dimensions than silicon which was already recommended as a solvent.

The fact that in the known method in which iron was locally applied to a graphite substrate, no whisker growth by means of a VLS-mechanism was found, may be due to the circumstance that a graphite substrate was employed and that with the use of a small quantity of iron the whole quantity of iron was converted to carbide at the crystallization temperature so that no iron any more was available for VLS-growth.

The invention, which is based on the observations and considerations described above, relates to a method of manufacturing filamentary crystals of silicon carbide in which the silicon carbide grows from a gaseous phase by means of a VLS-mechanism on a substrate and is characterized in that for the transmission of silicon carbide from the gaseous phase to the substrate iron is used as a solvent, for which purpose iron is locally applied to the substrate in finely divided state and is exposed at temperature from 1150° C more specially exceeding 1200° C, but generally not exceeding 1400° C to a gaseous phase containing silicon and carbon, silicon carbide being absorbed into the iron droplets and deposited on the substrate in the form of filamentary crystals.

It is not necessary for the iron to be used in the pure state. Evidently, there is no objection to the use of iron already containing carbon or silicon. The iron may also contain other alloying elements. An improvement due to the addition of alloying elements could not be found, however.

In this description and in the claims, the term "iron" is therefore to include not only pure iron but also carbon steels and alloyed steels.

The iron may be applied to the substrate in various manners for obtaining the finely divided state, for example, by brushing it on a superficially roughened substrate, by dusting with iron powder or by vapour deposition. In the latter case the finely divided state is obtained in the heating step, in which, on melting, any coherent layer may contract to separate droplets.

In this method, suitable materials for the substrates are generally those which are capable of withstanding the said temperatures such as graphite, alumina and silicon carbide. When the substrate consists of graphite which strongly reacts with iron, it is of course required that a sufficient quantity of iron is applied to the substrate so that it is not entirely consumed already before the crystallization has initiated. In such cases, for example, very thin iron layers for instance less than 1 $\mu$ and deposited from the vapour phase are found to be unsuitable.

As silicon- and carbon-containing gases, use may be made of alkylhalogen silanes, for example, methylchlorosilanes or mixtures of hydrocarbons and silicon tetrahalides or a halogen silane such as $SiHCl_3$. In these cases, the gaseous phase must contain hydrogen in order to obtain the desired pyrolitic dissociation of the silicon compounds. When $SiH_4$ is used, which readily dissociates and can be used in combination with a hydrocarbon, the presence of hydrogen is not required. In this case, an inert gas, for example, argon can be used as carrier gas. However, a silicon- and carbon-containing gaseous phase consisting in known manner of the cheap starting substances silica and carbon in a hydrogen atmosphere, is preferred.

The crystals obtained may consist in part of cubic and in part of hexagonal silicon carbide. If hexagonal silicon carbide crystals are used as substrate the growth of whiskers is more pronounced on prismal and pyramidal surfaces than on base surfaces (surfaces perpendicular to the C-axis).

As already stated above, the whiskers can be used for various purposes with regard to their favourable mechanical properties and their chemical resistance.

When used for mechanical reinforcement of articles, the crystals may be incorporated into materials, such as plastics, glasses and metals, during the shaping of said articles, while when used for heat-insulation purposes and in filters, they can be pressed, for example, in a mould to plates, blocks and the like the cohesion of which may be improved by sintering.

Apart from the above applications, the silicon carbide crystals according to the invention are particularly suitable for use in the construction of semiconductor devices. The small cross-section of the crystals provides the possibility of constructing devices of miniature dimensions and moreover the great flexibility of the crystals in their longitudinal direction provides the possibility of obtaining curved and rolled-up structures. If p-n junctions are required in the crystals used in semi-conductor devices, these junctions can be obtained during the growth of the crystals by doping alternately donors and acceptors into the gaseous phase from which the crystallization takes place. It is preferred, however, that the iron used for the whisker growth should contain a constituent causing the silicon carbide to have a given conductivity type and that a dope is intermittently supplied through the gaseous phase which promotes other conductivity properties.

The aforementioned articles and devices consisting wholly or in part of crystals obtained by the method according to the invention should also be considered to lie within the scope of the invention.

The invention will now be described more fully with reference to the drawing and a few examples.

FIG. 1 is a diagrammatic sectional view of a device for carrying out the method according to the invention.

The device consists of a quartz vessel 1 in which a gas atmosphere of the desired composition can be maintained. The quartz vessel 1 surrounded by a glass sheath 2 for water-cooling.

In the vessel 1, a graphite crucible 4 having a height of 100 mm and an inner diameter of 50 mm is arranged on a support 3, which crucible is covered by a plate-shaped lid 5 so that the gas present in the quartz vessel 1 has access to the interior of the crucible. In the lid 5, there is provided a graphite tube 6 which permits of measuring the temperature by means of an optical pyrometer. The vessel 4 is enclosed by a sheet 7 of thermally insulating graphite felt. For heating the device an induction coil 8 surrounds the quartz vessel 1. The lid 5 is used as a substrate for the deposition of the crystals.

Figure 2:
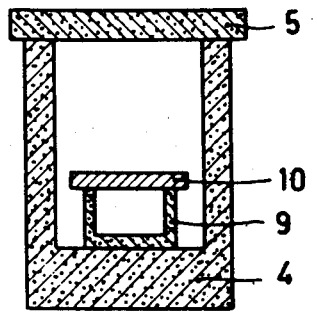

FIG. 2 shows a part of another embodiment of the device. In the vessel 4 of FIG. 1, there is arranged on a support 9 a substrate 10 on which the crystals can grow in an upright position instead of in a hanging position as in the arrangement of FIG. 1. Also in this case, the vessel 4 is covered by a plate 5 in the manner shown in FIG. 1.

EXAMPLE 1

The plate 5 of FIG. 1 consists of hexagonal silicon carbide crystals and is obtained by sublimation on a graphite plate at 2600° C. The plate 5 is rubbed with iron powder having a grain size of approximately 5 $\mu$. Silica is introduced into the crucible 4 and reacts upon heating in a hydrogen atmosphere maintained in the quartz vessel 1 with the carbon of the crucible 4, a silicon- and carbon-containing vapour being developed. By absorption of said vapour into the iron grains which then melt and by deposition of silicon carbide therefrom on the substrate, filamentary crystals grow in a hanging position on said substrate, which crystals generally bear at their free ends an iron globule. When the heating of the crucible is performed at a temperature of 1280° C by means of the induction coil 8, whiskers were obtained in 65 hours having an average thickness of 10 $\mu$ and a length of up to 6 cm.

EXAMPLE 2

An alumina substrate is dusted with iron powder having a grain size of apprxoimately 250 $\mu$ and is placed in the crucible 4 in a position denoted by 10 in FIG. 2. Silica is introduced into the crucible 4 said silica reacting upon heating in a hydrogen atmosphere maintained in the quartz vessel 1 with the carbon of the crucible, such that a silicon- and carbon-containing vapour is developed. By absorption of said vapour into the iron grains which then are in the molten state and by deposition of silicon carbide therefrom on the substrate 10, filamentary crystals (whiskers) grow on said substrate. When heating the crucible 4 at a temperature of 1220° C, crystals of an average length of 3 mm and a thickness of approximately 200 $\mu$ are obtained in 60 hours.

EXAMPLE 3

A graphite substrate is rubbed with iron powder having a grain size of 5 $\mu$. The substrate is used as a lid 5 for the crucible 4 in the manner shown in FIG. 1. Silica is introduced into the crucible 4 and the device is filled with hydrogen to atmospheric pressure. Upon heating at 1300° C, silicon carbide whiskers having a length of up to 2 cm and a thickness of 5 to 10 $\mu$ grow on the substrate by means of a VLS-mechanism in 50 hours.

EXAMPLE 4

Figure 3:

As shown in sectional view in FIG. 3 of the drawing, whiskers 11 obtained by Example 1 are disposed parallel in a graphite mould 12 up to a height of 1 mm, said mould having a length of 6 cm, a width of 2 cm and a height of 1 cm. The mould is filled by half with aluminium at a temperature of 700° C. After cooling, the block obtained is removed from the mould and is rolled in a direction at right angles to the longitudinal direction of the whiskers forming a foil having a thickness of 100 μ. In the longitudinal direction of the whiskers, the foil obtained has a considerable greater tensile strength than a foil obtained in the same manner but without the addition of whiskers.

EXAMPLE 5

Figure 4:

FIG. 4 is a sectional view of a filter. The plate-shaped filter is composed of a platinum dish 13 the bottom of which has apertures 14. A layer of whiskers 15 obtained by Example 3 having a thickness of 2 mm is stacked in arbitrary directions on the bottom of the dish.

With regard to its high chemical resistance, the filter obtained is suitable for filtering very reactive liquids and gases.

EXAMPLE 6

A device as shown in FIG. 1 is used in which the substrate 5 consists of hexagonal silicon carbide crystals. The substrate is obtained in the manner indicated in Example 1.

The plate 5 is rubbed with iron powder alloyed with 10% by weight of aluminium and having an average grain size of 5 μ. Silica is introduced into the crucible 4 and reacts upon heating in a hydrogen atmosphere maintained in the quartz vessel 1 with the carbon of the crucible, a silicon- and carbon-containing vapour being developed. This vapour is then absorbed into the grains of the iron-aluminium alloy which then melt. Upon heating, filamentary silicon carbide crystals having a thickness of approximately 10 μ are deposited from this melt by means of the induction coil 8 on the substrate at a temperature of 1250° C. The p-type conducting crystals obtained contain $10^{19}$ aluminium atoms per $cm^3$. If the hydrogen atmosphere is replaced by ammonia, n-type conducting silicon carbide is deposited.

When each time after 4 hours the hydrogen is replaced for 1 hour by ammonia, in 50 hours silicon carbide whiskers having a length of approximately 4 cm and having alternately then p-type conducting and n-type conducting regions are obtained.

The iron globules at one of the ends of the crystals may be utilized as electrical contacts. Further contacts may be established by alloying contact material consisting of gold with 5% by weight of tantalum.

The p- and n-type regions of the whisker may be provided with contacts by alloying gold-tantalum wire of 5 μ thickness. The various contacted parts may then be used separately or in combination as miniature diodes and transistors.

If required, the whiskers can be used in a curved state.

What is claimed is:
1. A method of manufacturing filamentary crystals of silicon carbide, comprising the steps of:
    applying elemental iron in finely divided form to a substrate surface capable of withstanding temperatures in the range of 1150° C to 1400° C; and
    exposing said substrate surface to an atmosphere containing carbon and silicon at a temperature between 1150° C and 1400° C, until droplets comprising iron form on said surface dissolving carbon and silicon from said atmosphere and filamentary crystals of silicon carbide of desired length grow from said surface at the sites of said droplets carrying said droplets away from said surface on the ends of said crystals.
2. A method as defined in claim 1 wherein said atmosphere is created by reacting elemental carbon and silica with hydrogen gas.
3. A method as defined in claim 1 wherein said atmosphere contains hydrogen gas.
4. A method as defined in claim 1 wherein said substrate surface is composed of a material selected from the group consisting of alumina, graphite, silicon carbide and mixtures of said group.
5. A method as defined in claim 1 wherein said elemental iron applied to said surface is of an alloy having iron as the principal constituent.

* * * * *